United States Patent
Müller et al.

(10) Patent No.: US 7,081,798 B2
(45) Date of Patent: Jul. 25, 2006

(54) VARIABLE FREQUENCY SYNTHESIZER COMPRISING A SIGMA-DELTA MODULATOR

(75) Inventors: Bardo Müller, Dreieich (DE); Jörg Hüster, Langen (DE); Thomas Musch, Mühlheim/Ruhr (DE)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/197,778

(22) Filed: Aug. 5, 2005

(65) Prior Publication Data

US 2006/0055469 A1    Mar. 16, 2006

Related U.S. Application Data

(63) Continuation of application No. PCT/EP03/08233, filed on Jul. 25, 2003.

(51) Int. Cl.
*H03L 7/00*   (2006.01)
*H03C 3/06*   (2006.01)

(52) U.S. Cl. ............... 331/23; 331/14; 332/128

(58) Field of Classification Search ............ 331/23, 331/14; 322/128
See application file for complete search history.

(56) References Cited

U.S. PATENT DOCUMENTS

| | | | | |
|---|---|---|---|---|
| 5,305,362 A | * | 4/1994 | Miller | 377/48 |
| 6,876,698 B1 | * | 4/2005 | Dick et al. | 375/229 |
| 2002/0061086 A1 | * | 5/2002 | Adachi et al. | 375/376 |
| 2003/0058055 A1 | | 3/2003 | Sridharan | |

FOREIGN PATENT DOCUMENTS

EP    0 438 867 A2    7/1991

OTHER PUBLICATIONS

V.F. Kroupa, et al.; "Direct Digital Frequency Synthesizers With The Arrangement in the PLL Systems"; The Iree of the Academy of Sciences of the Czech Republic; pp. 799-805.

* cited by examiner

*Primary Examiner*—Joseph Chang
(74) *Attorney, Agent, or Firm*—Arent Fox, PLLC.

(57) ABSTRACT

A variable frequency synthesizer comprising a sigma-delta modulator is provided. Such synthesizers provide an exact average frequency whereas the instantaneous frequencies varies. The sigma-delta modulator comprises a plurality of accumulator stages being connected in cascade. At least one input value of an accumulator (51, 52, 53, 54) being part of the sigma-delta modulator has a second component which is equal to an overflow signal ($of_1$, $of_2$, $of_3$, $of_4$) multiplied by a factor. This feedback reduces the-maximum fluctuation of the instantaneous frequencies. Phase jitter generated by non-linearities of the phase detector, the charge pump and the VCO is therefore reduced.

6 Claims, 12 Drawing Sheets

Fig. 1 State of the Art

Fig. 2
State of the Art

Fig. 3
State of the Art

Fig. 4 State of the Art

| cycle number | content AC51 | content AC52 | content AC53 | content AC54 | $of_1$ | $of_2$ | $of_3$ | $of_4$ | $con_1$ | $con_2$ | $con_3$ | $con_4$ | ΔN |
|---|---|---|---|---|---|---|---|---|---|---|---|---|---|
| 0 | 0 | 0 | 0 | 0 | 0 | 0 | 0 | 0 | 0 | 0 | 0 | 0 | 0 |
| 1 | 10 | 10 | 10 | 10 | 0 | 0 | 0 | 0 | 0 | 0 | 0 | 0 | 0 |
| 2 | 20 | 30 | 8 | 18 | 0 | 0 | 1 | 1 | 0 | 0 | 1 | 0 | 1 |
| 3 | 30 | 28 | 20 | 6 | 0 | 1 | 1 | 1 | 1 | 1 | -1 | 1 | 1 |
| 4 | 8 | 20 | 24 | 14 | 1 | 1 | 1 | 1 | 1 | 0 | 0 | -2 | -1 |
| 5 | 2 | 6 | 14 | 12 | 1 | 1 | 1 | 1 | 0 | 0 | 0 | 1 | 2 |
| 6 | 28 | 18 | 16 | 12 | 0 | 1 | 1 | 1 | 1 | 0 | 0 | 0 | 0 |
| 7 | 6 | 8 | 8 | 4 | 1 | 0 | 1 | 0 | 1 | -1 | 0 | 0 | 1 |
| 8 | 0 | 24 | 16 | 4 | 1 | 1 | 1 | 1 | 0 | 1 | 0 | 0 | 0 |
| 9 | 26 | 18 | 18 | 6 | 0 | 1 | 1 | 1 | 1 | 0 | 0 | 0 | 1 |
| 10 | 4 | 6 | 8 | 30 | 1 | 1 | 1 | 1 | 0 | 0 | 0 | -1 | 0 |
| 11 | 30 | 20 | 12 | 10 | 0 | 1 | 1 | 1 | 1 | 0 | 0 | 3 | 3 |
| 12 | 8 | 12 | 8 | 2 | 1 | 1 | 1 | 1 | 1 | 0 | 0 | -3 | -2 |
| 13 | 2 | 30 | 22 | 8 | 1 | 0 | 1 | 1 | 1 | -1 | 0 | 1 | 1 |

VARIABLE FREQUENCY SYNTHESIZER COMPRISING A SIGMA-DELTA MODULATOR

This nonprovisional application is a continuation application of and claims the benefit of International Application No. PCT/EP2003/08233, filed Jul. 25, 2003. The disclosure of the prior application is hereby incorporated herein in its entirety by reference.

The present invention generally relates to a frequency synthesizer and more particularly to a frequency synthesizer according to the preamble of claim 1, a divider ratio controller according to the preamble of claim 5 and a method for operating a divider ratio controller according to the preamble of claim 6.

Frequency synthesizers generate output signals having a frequency which is the exact multiple of a reference frequency. The accuracy of the frequency of the output signal is determined by the accuracy and stability of the reference frequency. In the state of the art, frequency synthesizers are often based on phase-locked loop (PLL) circuits.

Typically, a PLL comprises a phase detector circuit, an amplifier or charge pump, a filter circuit and a voltage controlled oscillator. The phase detector circuit detects the phase difference of two signals. One of these signals is a reference signal. The other one is generated in the PLL. The charge pump generates an analog signal with a high current drive suitable for the control of the VCO. The charge pump signal has usually two fixed current values of the same amount, but opposite sign corresponding to the digital 0 and 1 provided by the phase detector and indicating the existence of a phase difference between the two signals compared by the phase detector. The frequency of the VCO is adjusted until the reference signal and the signal which is compared to the reference signal are synchronized.

Before the signal provided by the charge pump is fed to the VCO, high frequency noise is usually attenuated in a loop filter. This filter is a low-pass filter and averages the signal provided by the charge pump. The signal of the VCO is firstly divided by a divider and then fed into the phase detector. The VCO therefore generates a frequency which is by a factor given by the inverse of the divider ratio higher than the reference frequency.

Typically, frequency divider circuits can only divide by an integer value. Thus, an incremental change in the output frequency cannot be smaller than the reference frequency itself. Hence, a very low reference frequency would be required in order to provide a frequency synthesizer having a small step size. However, low reference frequencies are not acceptable because they limit the frequency range and result in long settling times.

Small step sizes can be achieved using fractional frequency dividers. Such dividers realize non-integer division ratios by changing the divider ratio between integer values during a number of division cycles as disclosed in U.S. Pat. No. 3,928,813 filed by C. A. Kingsford-Smith on Dec. 23, 1973. If the desired frequency is for example 1000.1 Hz and the reference frequency is 1 MHz, the divider ratio may be 1000 for nine cycles and 1001 for one cycle.

Only the average frequency provided by such PLL circuits is correct whereas the instantaneous divider ratio is never correct resulting in phase errors at the output of the phase detector. The phase error signals modulate the frequency of the VCO which generates in consequence spurious signals known as phase jitter. In order to alleviate the problems associated to jitter, a signal for the correction of the phase error can be applied—a technique known as phase interpolation. However, an accurate signal for the correction of the phase error is difficult to generate and the technique requires complex and expensive circuitry.

DE 690 23 219 discloses a frequency synthesizer wherein the divider ratio is controlled by a sigma-delta modulator circuit. Advantageously, phase noise with a low frequency and therefore spurious signals are suppressed. However, the resulting changes in the divider ratio can be relatively large. For such changes, the signal applied to the VCO is no more a linear function of the phase shift detected by the phase detector so that the VCO does not generate the average frequency it should actually generate. As a result, the average frequency of the signal generated in the PLL circuit may also contain a considerable amount of noise.

EP 125790 filed by N. J. Wells on Apr. 11, 1984 describes an advantageous frequency synthesizer wherein the phase noise is suppressed by altering the divider ratio in accordance with a plurality of sequences representing successive rows in a Pascal's triangle summing to zero. However, this frequency synthesizer is as well quite noisy for low frequencies leading to the problems described above.

Figure 1:
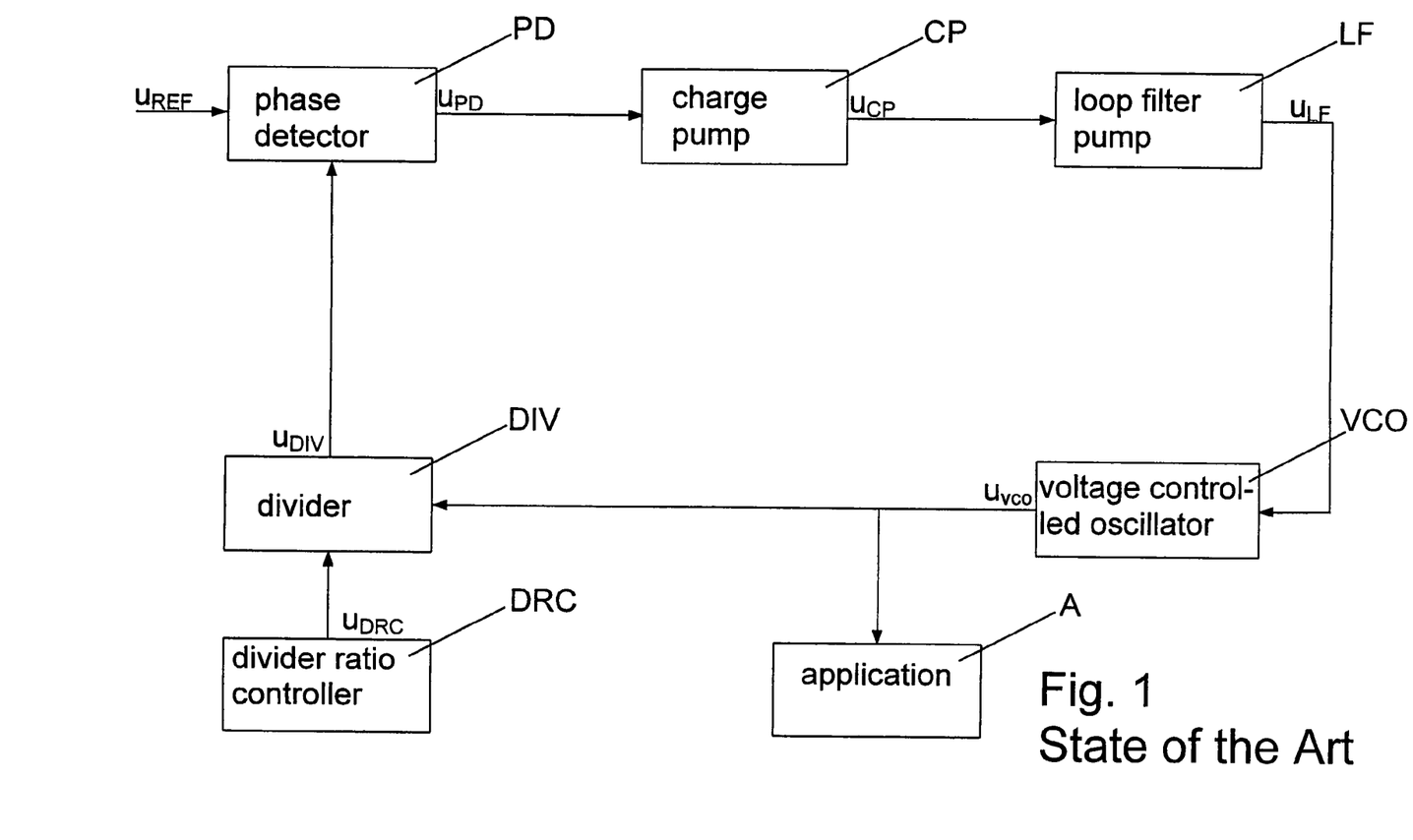
FIG. 1 is a diagram of PLL circuit in the state of the art.
Figure 2:
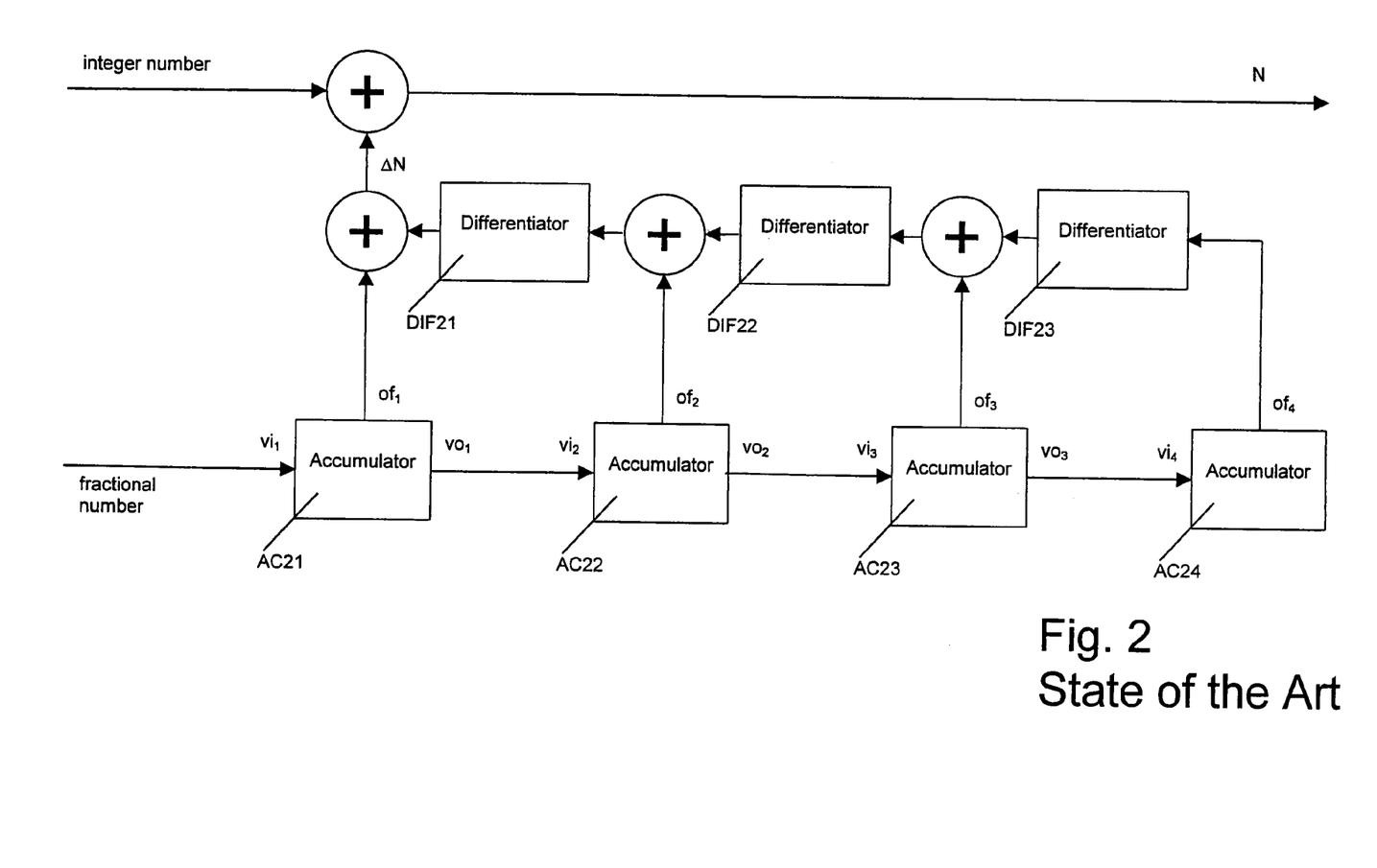
FIG. 2 is a diagram of corresponding divider ratio controller in the state of the art.

According to the application note "Fractional-N Synthesizers" by David Owen (IFR Americas, Inc.), the frequency synthesizer disclosed in EP 125790 can be implemented using a divider ratio controller shown in FIG. 2. Said divider ratio controller consists of a number of accumulators AC21, AC22, AC23, AC24 connected in cascade. The output of an accumulator is connected to the input of the next accumulator in the cascade. The fractional number, i.e. the fractional component of the intended average divider ratio, is provided at the input of the first accumulator. The accumulators overflow when the value stored in the accumulator surpasses a limit given by the capacity of the respective accumulators and generate the overflow signals $of_1$, $of_2$, $of_3$, and $of_4$. These overflow signals are differentiated by the differentiators DIF21, DIF22, DIF23, and DIF24 and added to form the signal $\Delta N$ which is added to the integer word, i.e. the integer component of the intended average divider ratio.

Figure 3:
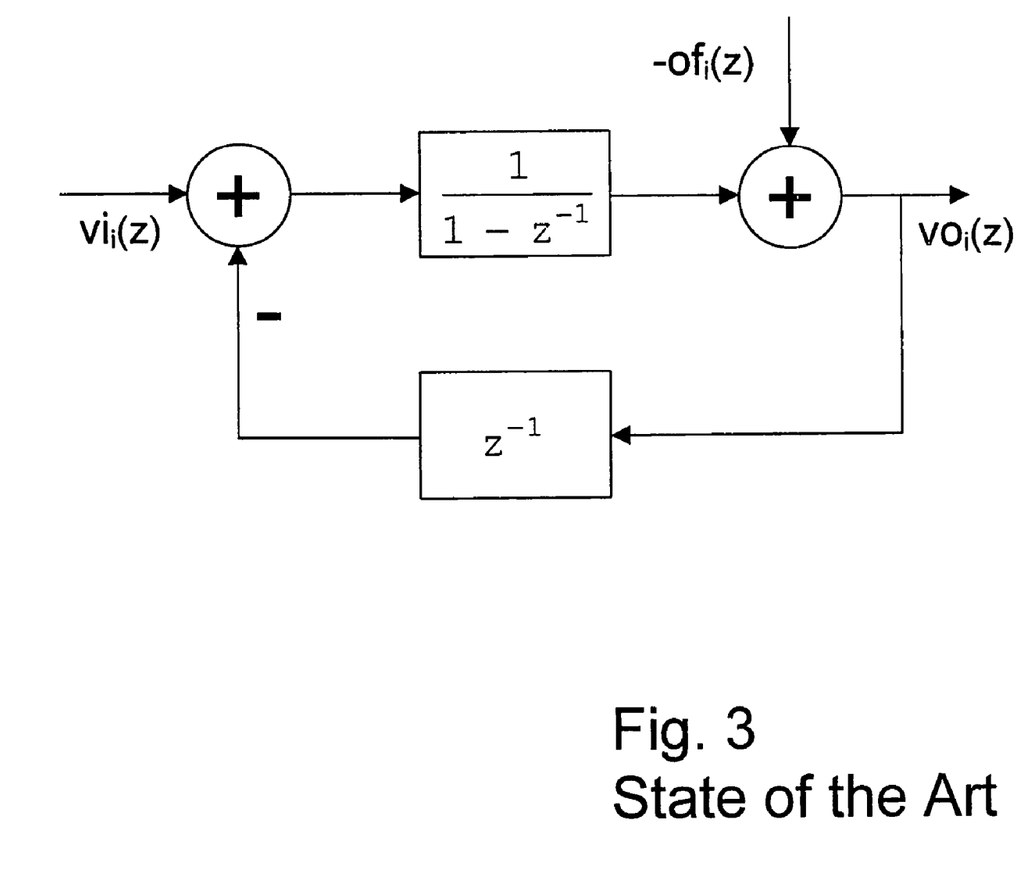
FIG. 3 is a model of an accumulator stage in the state of the art.

A model of a basic accumulator stage is shown in FIG. 3. In this representation, z is the Laplace variable in the discrete time domain, $vi_i(z)$, $vo_i(z)$, and $of_i(z)$ are the z-transforms of the input signal $vi_i$ of the accumulator stage, the output signal $vo_i$ of the accumulator stage, and the overflow signal $of_i$, respectively (Below, the $vi_i(z)$ is abbreviated as $vi_i$ etc . . . ). $1/(1-z^{-1})$ is the transfer function of the accumulator stage. Hence, $vi_i$ can be expressed as:

$$vi_i = (1-z^{-1}) \cdot (vo_i + of_i) - z^{-1} \cdot of_i \quad (1)$$

Using equation (1), $of_i$ can be written as:

$$of_i = -vo_i \cdot (1-z^{-1}) + vi_i \quad (2)$$

The output signal $vo_i$ of the accumulator stage is the input signal $vi_{i+1}$ of the next accumulator stage, i.e. the accumulator stage of the order i+1. Hence, $of_{i+1}$ can be expressed as:

$$of_{i+1} = -vo_{i+1} \cdot (1-z^{-1}) + vo_i \quad (3)$$

Differentiating $of_{i+1}$, i.e. multiplying by the delay operator $D=(1-z^{-1})$, and adding $D \cdot of_{i+1}$ and $of_i$ results in the compensation of $vo_i$:

$$D \cdot of_{i+1} + of_i = -vo_i \cdot (1-z^{-1}) + vi_i + (1-z^{-1}) \cdot \quad (4)$$
$$((-vo_{i+1} \cdot (1-z^{-1}) + vo_i))$$
$$= vi_i - (1-z^{-1})^2 \cdot vo_{1+1}$$

The same scheme can be extended to a system with m accumulator stages. For such a system, the output signal ΔN of the sigma-delta modulator is given by:

$$\Delta N = vi_0 - (1-z^{-1})^m \cdot vo_m \qquad (5)$$

As the rate of change of the content of an accumulators increases with its order, the rate of change of N increases as well with increasing number of accumulators. Quick fluctuations of N disturb the operation of the variable frequency synthesizer less than slow oscillations because the low-pass filter attenuates the high-frequency noise contained in the signal provided at its input. In consequence, phase jitter is reduced.

Using $z = e^{j\omega_n}$ where $\omega_n$ is a standardized frequency ($|z^1| \leq 1$), the maximum fluctuation $g_m$ of ΔN can be estimated:

$$g_m = |(1-z^{-1})^m \cdot vo_m| \qquad (6)$$

Normalizing the frequency of the capacitance, $vo_m$ will be smaller than 1 ($vo_m < 1$). Using $v_m = 1$, a value of $g_m$ independent of the actual capacitance can be found.

Figure 4:
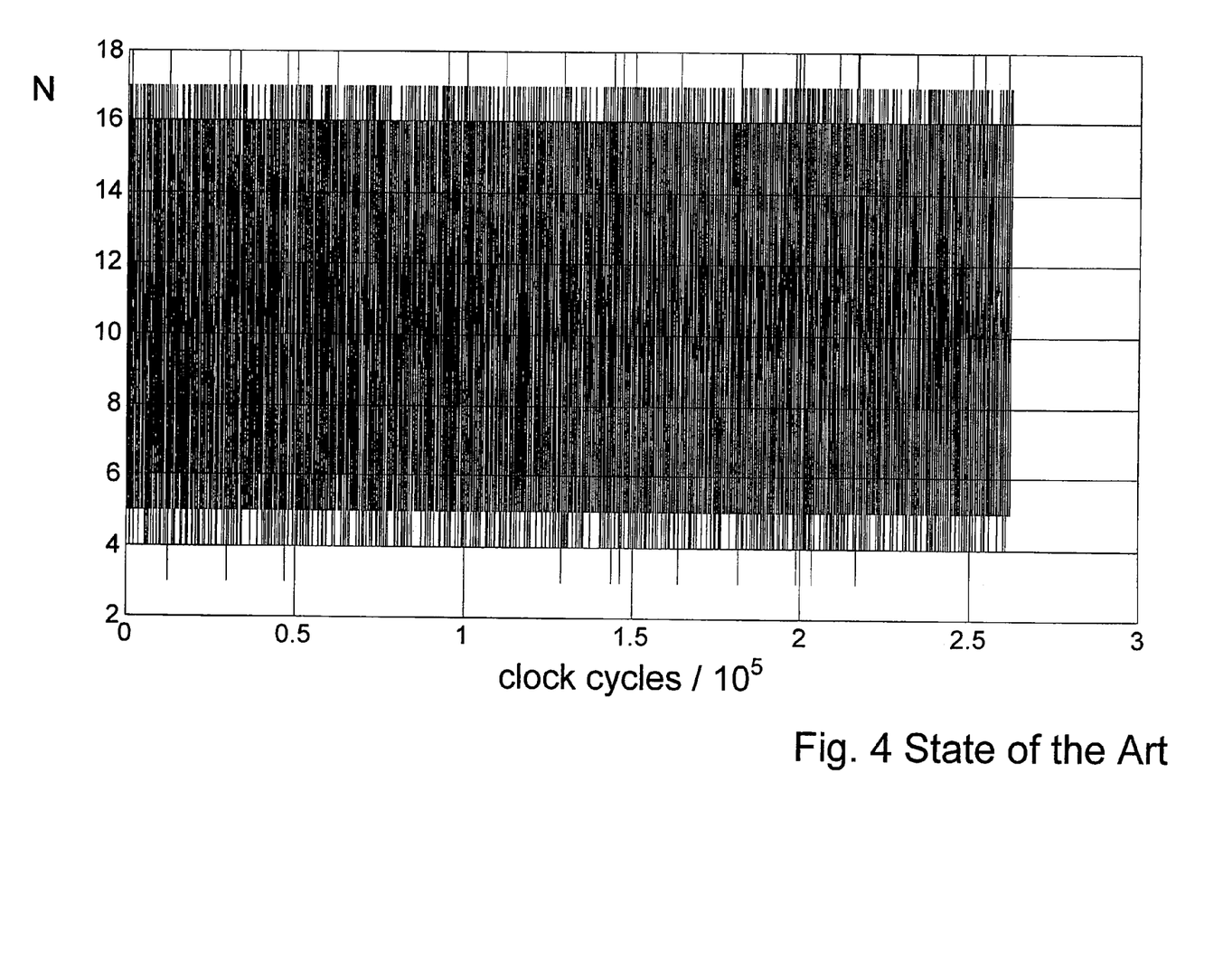
FIG. 4 is a graph of an output signal of said divider ratio controller in the state of the art.

Referring to FIG. 4, a graph of an output signal of the divider ratio controller with four stages is shown for the intended average divider ratio $N_{int} = 10.62501526$. According to eq. (6), the maximum fluctuation $g_m$ is 16.

The problem underlying the present invention is to provide an improved variable frequency synthesizer. Furthermore, a corresponding divider ratio controller and an advantageous method for operating the divider ratio controller are to be provided.

The problem underlying the present invention is solved for a variable frequency synthesizer according to the preamble of claim 1 by the features of the characterizing portion of claim 1.

According to claim 1, a variable frequency synthesizer comprising: a voltage controlled oscillator generating oscillator signals with a frequency dependent on input signals applied to said voltage controlled oscillator; a frequency divider receiving said oscillator signals and generating divider signals with a frequency which is equal to a frequency of said oscillator signals divided by a divider ratio; a phase detector providing phase difference signals on the basis of a phase difference between said divider signals and reference signals, said phase difference signals determining said input signals applied to said voltage controlled oscillator; a divider ratio controller comprising a sigma-delta modulator and providing said divider ratio, said sigma-delta modulator comprising a plurality of accumulator stages being connected in cascade, each accumulator stage adding up input values and providing an overflow signal value when a maximum value is reached, a first accumulator stage in said cascade receiving a fractional part of an intended average divider ratio as a first component of an input value, each following accumulator receiving an accumulator value of an accumulator preceding said following accumulator and adjacent to said following accumulator as a first component of an input value, each overflow signal value being differentiated as many times as accumulator stages are preceding an accumulator stage providing said respective overflow signal value in said cascade before all overflow signal values are added up to form an output signal of said sigma-delta modulator, said divider ratio being a sum of said output signal of said sigma-delta modulator and an integer part of an intended average divider ratio; is characterized in that at least one input value has a second component which is equal to an overflow signal multiplied by a factor.

An advantage of the present invention is that the fluctuation of the divider ratio and, in consequence, phase jitter are reduced.

In one feature of the present invention, each accumulator stage receives an input value having a second component which is equal to an overflow signal of said respective accumulator stage multiplied by a factor.

In a further feature of the present invention, a charge pump circuit is connected between said phase detector and said voltage controlled oscillator receiving said phase detector signals and providing charge pump signals at the input of said voltage controlled oscillator.

In a further development of the present invention, a loop filter is connected between said charge pump and said voltage controlled oscillator filtering said charge pump signals before providing them at the input of said voltage controlled oscillator.

The problem is solved for a divider ratio controller according to the preamble of claim 5 by the features of the characterizing portion of claim 5.

According to claim 5, a divider ratio controller in a variable frequency synthesizer comprising: a voltage controlled oscillator generating oscillator signals with a frequency dependent on input signals applied to said voltage controlled oscillator; a frequency divider receiving said oscillator signals and generating divider signals with a frequency which is equal to a frequency of the oscillator signals divided by a divider ratio; a phase detector providing phase difference signals on the basis of the phase difference between said divider signals and reference signals, said phase difference signals determining said input signals applied to said voltage controlled oscillator; said divider ratio controller comprising a sigma-delta modulator and providing said divider ratio, said sigma-delta modulator comprising a plurality of accumulator stages being connected in cascade, each accumulator stage adding up input values and providing an overflow signal value when a maximum value is reached, a first accumulator stage in said cascade receiving a fractional part of an intended average divider ratio as a first component of an input value, each following accumulator receiving an accumulator value of an accumulator preceding said following accumulator and adjacent to said following accumulator as a first component of an input value, each overflow signal value being differentiated as many times as accumulator stages are preceding an accumulator stage providing said respective overflow signal value in said cascade before all overflow signal values are added up to form an output signal of said sigma-delta modulator, said divider ratio being a sum of said output signal of said sigma-delta modulator and an integer part of an intended average divider ratio; is characterized in that at least one input value has a second component which is equal to an overflow signal multiplied by a factor.

The problem is solved for a method for operating the divider ratio controller according to the preamble of claim 6 by the features of the characterizing portion of claim 6.

According to claim 6, a method for operating a divider ratio controller in a variable frequency synthesizer with a voltage controlled oscillator generating oscillator signals with a frequency dependent on input signals applied to said voltage controlled oscillator, a frequency divider receiving said oscillator signals and generating divider signals with a frequency which is equal to a frequency of said oscillator signals divided by a divider ratio, a phase detector providing phase difference signals on the basis of the phase difference between said divider signals and reference signals, said phase difference signals determining said input signals applied to said voltage controlled oscillator, said divider ratio controller comprising a sigma-delta modulator with a plurality of accumulator stages and providing said divider ratio, said accumulator stages being connected in cascade, comprising the following steps: a first accumulator stage in said cascade receiving a fractional part of an intended average divider ratio as a first component of an input value, each following accumulator receiving an accumulator value of an accumulator preceding said following accumulator and adjacent to said following accumulator as a first component of an input value; each accumulator stage adding up input values; each accumulator stage providing an overflow signal value when a maximum value is reached; each overflow signal value being differentiated as many times as accumulator stages are preceding an accumulator stage providing said respective overflow signal value in said cascade; adding up said overflow signals of said sigma-delta modulators and an integer part of an intended average divider ratio to generate said divider ratio; is characterized by the following step: an overflow signal being multiplied by a factor and being provided as second component of an input value.

Embodiments of the present invention will now be described, by the way of example only, with reference to the following drawings in which.

Figure 5:
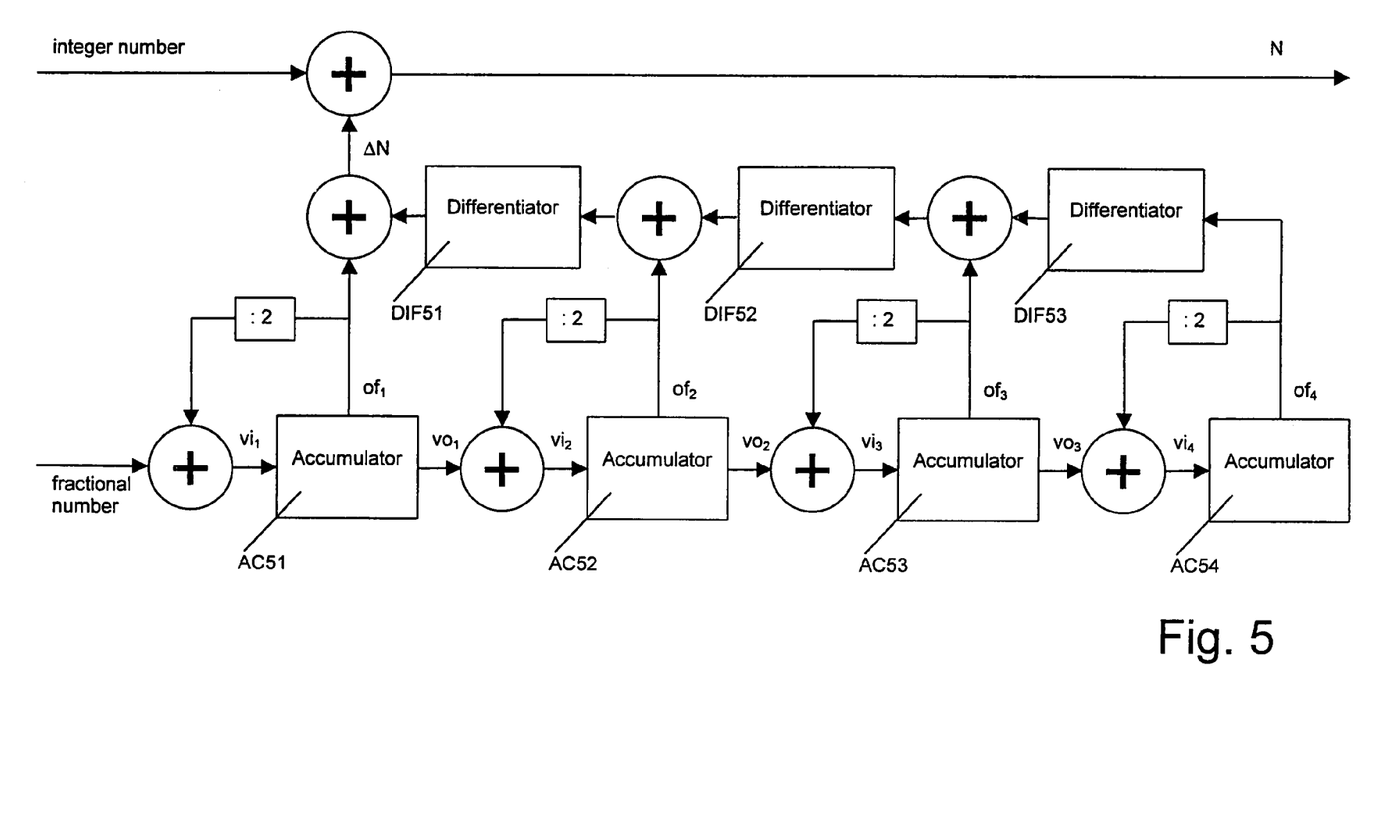
FIG. 5 is a diagram of a divider ratio controller according to the invention.

Referring to FIG. 5, a divider ratio controller consists of a number of accumulators AC51, AC52, AC53, AC54 connected in cascade. The output of an accumulator is connected to the input of the next accumulator in the cascade. The accumulators overflow when the value stored in the accumulator surpasses a limit given by the capacity of the respective accumulators and generate the overflow signals $of_1$, $of_2$, $of_3$, and $of_4$. These overflow signals are fed back to the inputs of the respective accumulators after division by a coupling factor K. Hence, the input signals of each accumulator has two components. The input signals of the first accumulator consist of the fractional number and the fed-back overflow signal, whereas the input signals of the following accumulators consist of the output signal of the preceding accumulator and the fed-back overflow signal. These overflow signals are differentiated by the differentiators DIF51, DIF52, DIF53, and DIF54 and added to form the signal ΔN which is added to the integer word. The number of accumulator stages is actually arbitrary. Four accumulator stages were chosen as this number is very suitable for the illustration of the basic operation principles.

Figure 6:
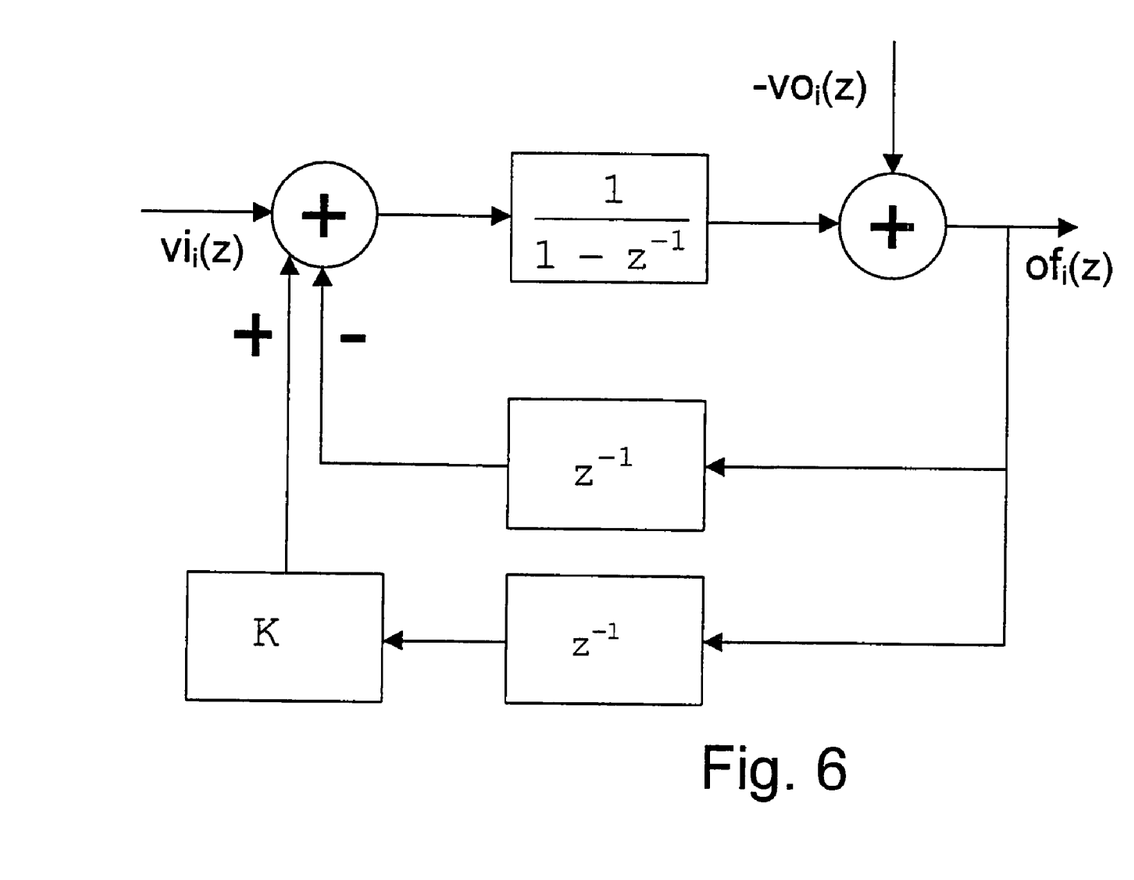
FIG. 6 is a model of an accumulator stage according to the invention.

A model of a basic accumulator stage is shown in FIG. 6 (Below, the $vi_i(z)$ is again abbreviated as $vi_i$ etc . . . ).

Analogous to equation (2), $of_i$ can be written as:

$$of_i = \frac{-vo_i \cdot (1 - z^{-1})}{1 - K \cdot z^{-1}} + \frac{vi_i}{1 - K \cdot z^{-1}} \quad (7)$$

The output signal $vo_i$ of the accumulator stage is the input signal $vi_{i+1}$ of the next accumulator stage, i.e. the accumulator stage of the order i+1. Hence, $of_{i+1}$ can be expressed as:

$$of_{i+1} = \frac{-vo_{i+1} \cdot (1 - z^{-1})}{1 - K \cdot z^{-1}} + \frac{vo_i}{1 - K \cdot z^{-1}} \quad (8)$$

Differentiating $of_{i+1}$, i.e. multiplying by $D=(1-z^{-1})$ and adding $D \cdot of_{i+1}$ and $of_i$ results in the compensation of $vo_i$ as in the state of the art.

The same scheme can again be extended to a system with m accumulator stages. For such a system, the output signal ΔN of the sigma-delta modulator is given by:

$$\Delta N = \frac{vo_0}{1 - K \cdot z^{-1}} + \frac{vo_m \cdot (1 - z^{-1})^m}{1 - K \cdot z^{-1}} \quad (9)$$

Hence, the maximum fluctuation $g_m$ of ΔN can be estimated:

$$g_m = \left| \frac{vo_m \cdot (1 - z^{-1})^m}{1 - K \cdot z^{-1}} \right| \quad (11)$$

For K=0, eq. (13) corresponds to eq. (6) describing the maximum fluctuation for a sigma-delta modulator in the state of the art.

Figure 7:
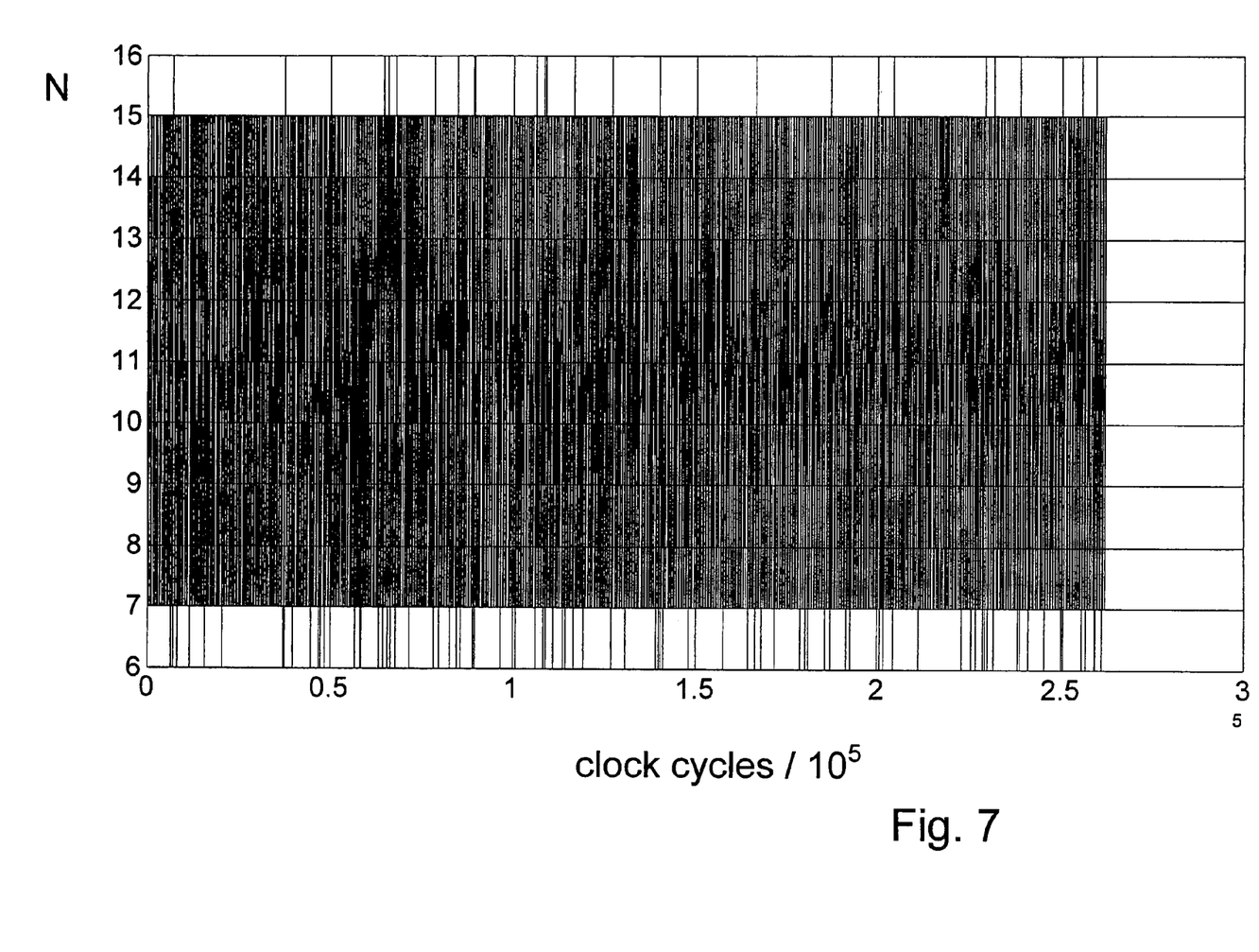
FIG. 7 is a graph of an output signal of said divider ratio controller according to the invention for K=0.5.

Referring to FIG. 7, a graph of an output signal of the divider ratio controller is shown for a coupling factor K=0.5 and the intended average divider ratio $N_{int}$=0.62501526. According to eq. (11), the maximum fluctuation $g_m$ is equal to 10.66. In comparison with the divider ratio controller of the state of the art, the maximum fluctuation $g_m$ is clearly reduced.

Figure 8:
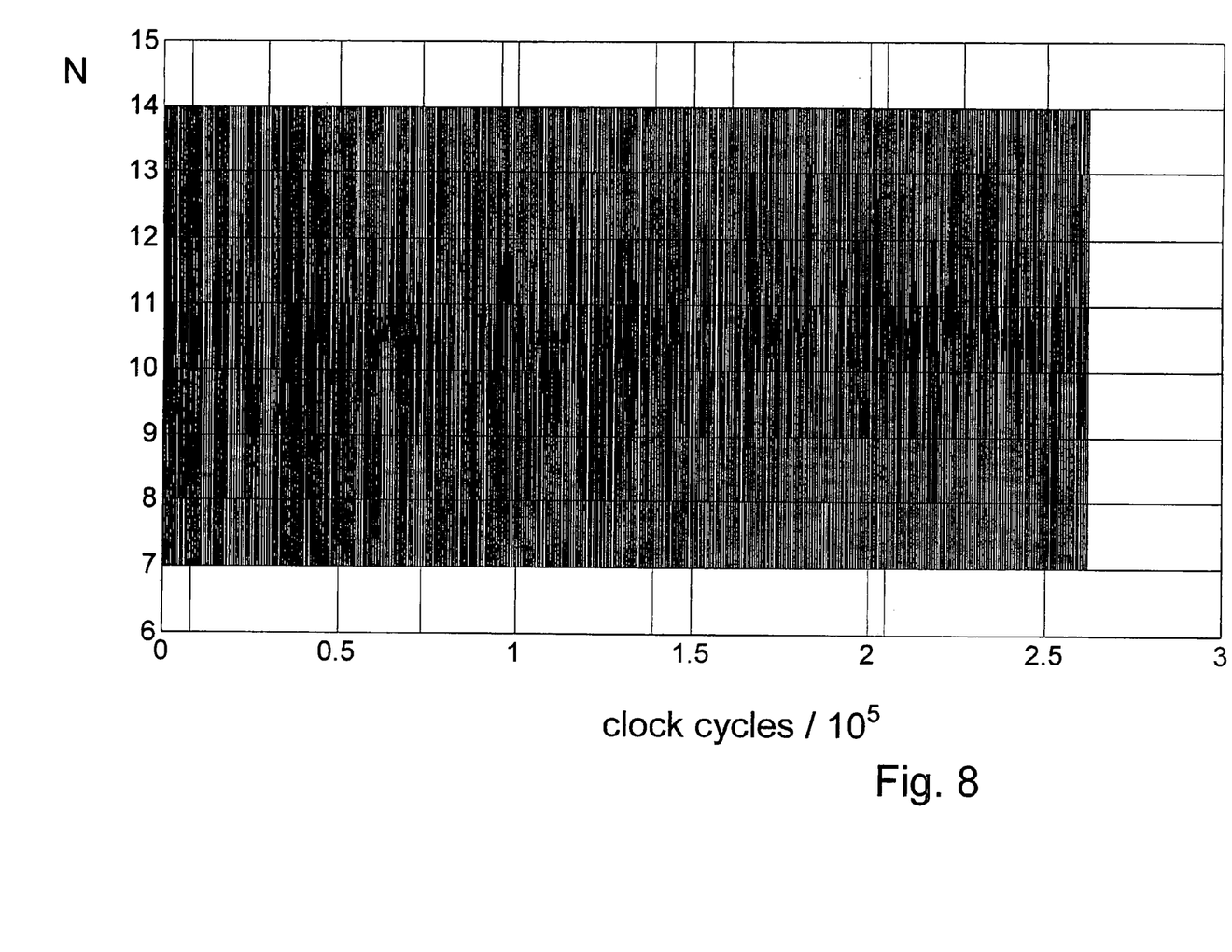
FIG. 8 is a graph of an output signal of said divider ratio controller according to the invention for K=0.75.

Referring to FIG. 8, a graph of an output signal of the divider ratio controller is shown for a coupling factor K=0.75 and the intended average divider ratio $N_{int}$=0.62501526. According to eq. (11), the maximum fluctuation $g_m$ is equal to 9,14. In comparison with the divider ratio controller with K=0.5, the maximum fluctuation $g_m$ is still further reduced.

Figure 9:
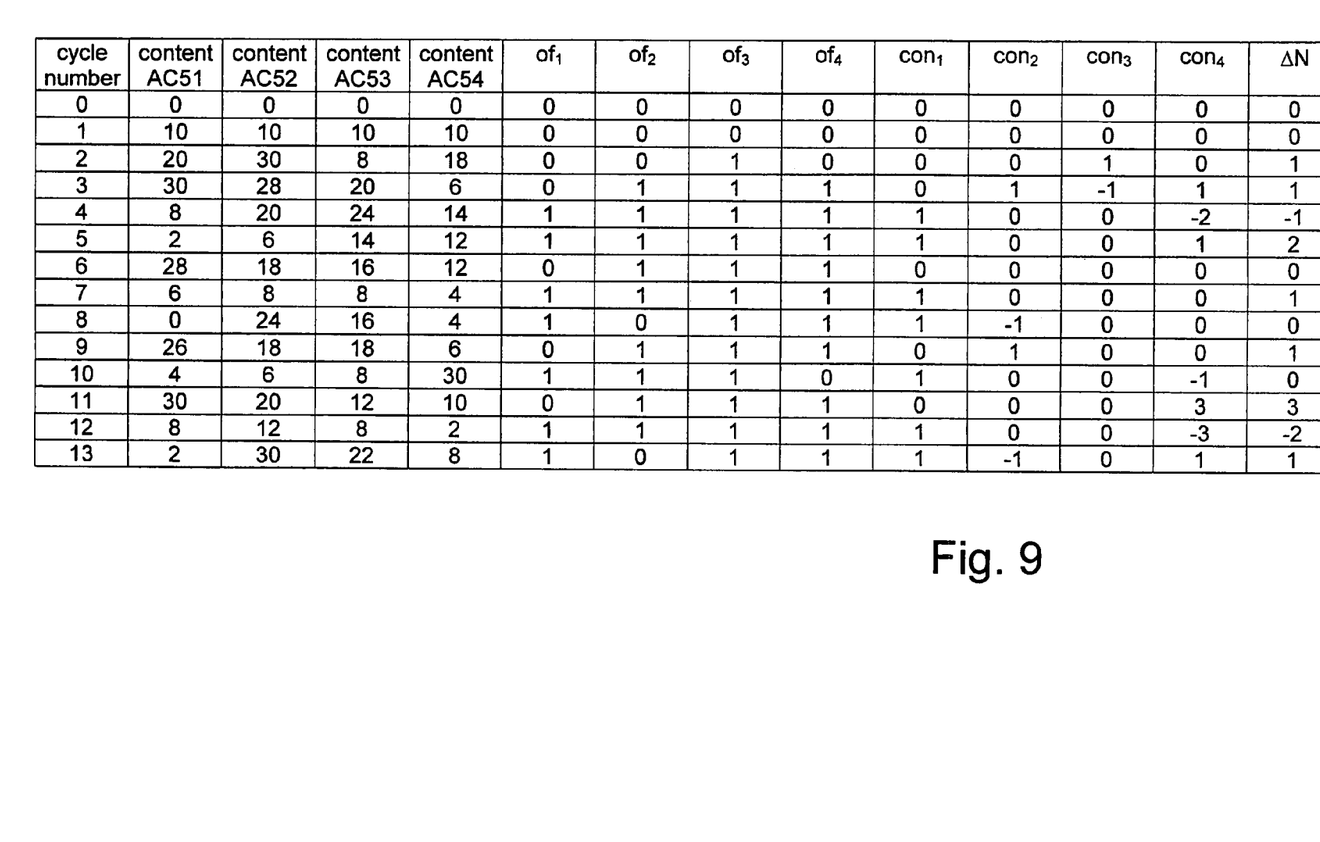
FIG. 9 is a table showing the dynamic behavior of said divider ratio controller according to the invention.

FIG. 9 illustrates the dynamic behavior of the divider ratio controller shown in FIG. 5. In this example, the capacity of each accumulator is 31. The fractional number is 10 corresponding to the numerical value of 0.625.

During the first cycle, the fractional word 10 is loaded in accumulator AC51. The input values of the following accumulators corresponds to the accumulator value of the accumulator directly preceding, i.e. the value stored in the respective accumulator. Therefore, the contents of the capacitors AC51, AC52, AC53, AC54 increase from 0 to 10.

During the second cycle, the input value of each accumulator is added to the content of the respective accumulator. The input value $vi_2$ of the accumulators AC52 corresponds to the output value $vo_1$ of the accumulator AC51 and so on. However, the accumulator value of the accumulator AC53 surpasses the capacity. Therefore, an overflow signal $of_3$ is generated. The accumulator value of the accumulator 53 is reduced by a value corresponding to an overflow signal, i.e. 32. The input value of the accumulator 54 corresponds again to the accumulator value of the accumulator 53. The overflow signal $of_3$ is differentiated twice by the differentiators DIF52, DIF51, and then added to the other overflow signals which are equal to zero.

Each differentiation corresponds to a multiplication by $(1-z^{-1})$. For a clock cycle i, $z^{-1}$ is equal to the overflow signal generated during the clock cycle i−1 and $z^{-2}$ is correspondingly equal to the overflow signal generated during the clock cycle i−2 etc. Thus, the contribution $con_3$ of the overflow signal $of_3$ to $\Delta N$ is given by:

$$con_3 = (1 - z^{-1})^2 \cdot of_3$$
$$= (1 - 2z^{-1} + z^{-2}) \cdot of_3$$
$$= (1 - 2 \cdot 0 + 0) \cdot 1 = 1$$

And $\Delta N$ is given by:

$$\Delta N = con_1 + con_2 + con_3 + con_4$$
$$= 0 + 0 + 1 + 0$$

During the third cycle, the overflow signal $of_3$ generated during the previous clock cycle is added to the output signal of the accumulator AC52 to form the input signal of the accumulator AC53 after multiplying the overflow signal by 16 (This multiplication is noted as a division by 2 in the diagram of the divider ratio controller. The coupling factor actually refers to the value corresponding to an overflow signal, i.e. 32.). For this cycle, the accumulators AC52 and AC54 overflow as well. The overflow signal $of_2$ of accumulator AC52 is differentiated once, before its contribution $con_2$ is added where con2 is given by:

$$con_2 = (1 - z^{-1}) \cdot of_2$$
$$= (1 - 0) \cdot 1 = 1$$

The overflow signal $of_4$ of accumulator AC54 is differentiated three times, before its contribution $con_4$ is added where $con_4$ is given by:

$$con_4 = (1 - z^{-1})^3 \cdot of_4$$
$$= (1 - 3z^{-1} + 3z^{-2} - z^{-3}) \cdot of_4$$
$$= (1 - 3 \cdot 0 + 3 \cdot 0 - 0) \cdot 1 = 1$$

The further contribution $con_3$ to $\Delta N$ is given by:

$$con_3 = (1 - z^{-1})^2 \cdot of_3$$
$$= (1 - 2z^{-1} + z^{-2}) \cdot of_3$$
$$= (1 - 2 \cdot 1 + 0) \cdot 1 = -1$$

Thus, $\Delta N$ is equal to:

$$\Delta N = con_1 + con_2 + con_3 + con_4$$
$$= 0 + 1 - 1 + 1 = 1$$

The further values in the table can be calculated according to the same scheme. As shown in FIG. 5, $of_4$ and $of_3$ for example are actually added after $of_4$ is differentiated once. However, the change of order does not influence the mathematical result and the chosen implementation requires less differentiators.

Figure 10:
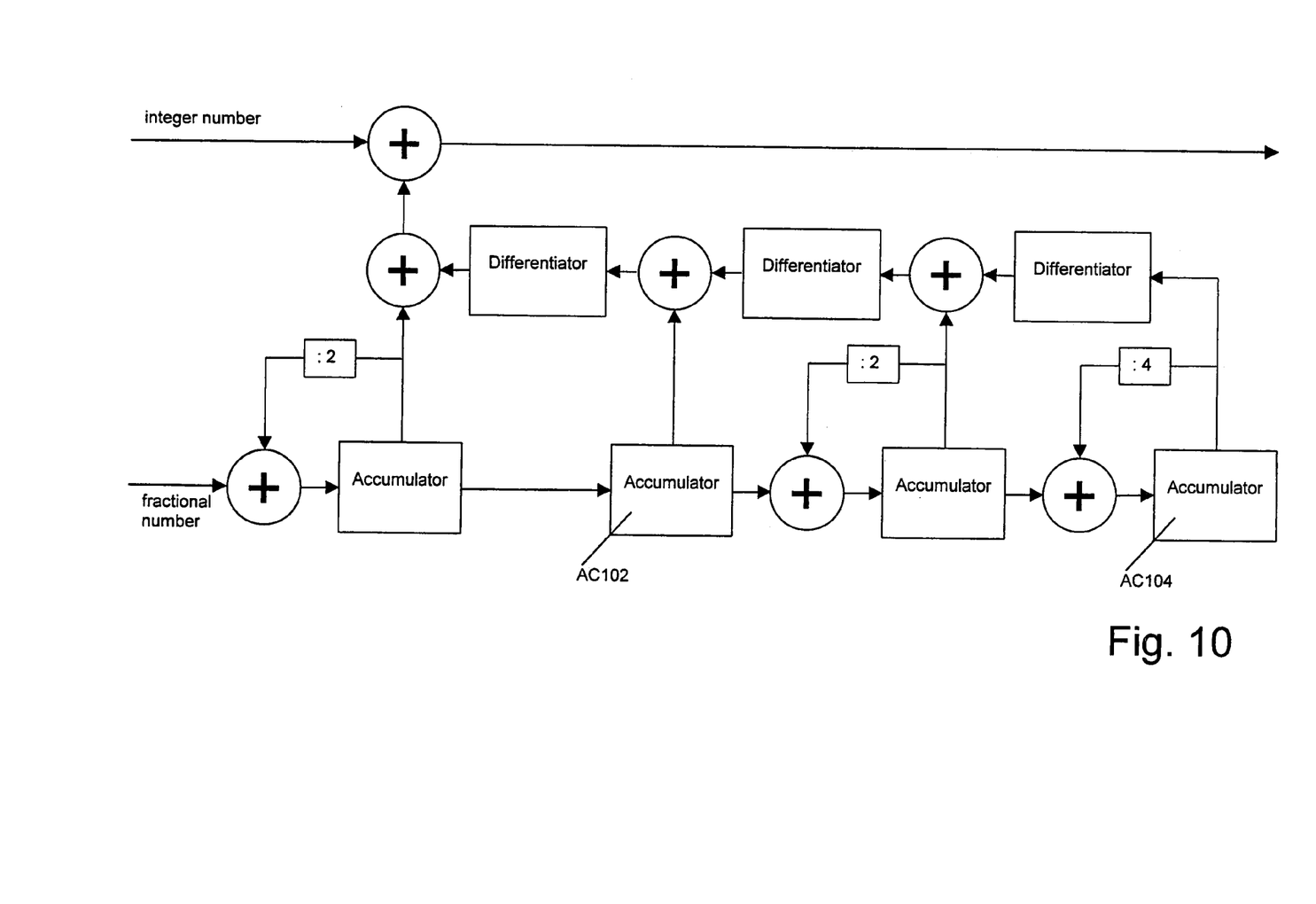
FIG. 10 is a first alternative embodiment of a divider ratio controller according to the invention.
Figure 11:
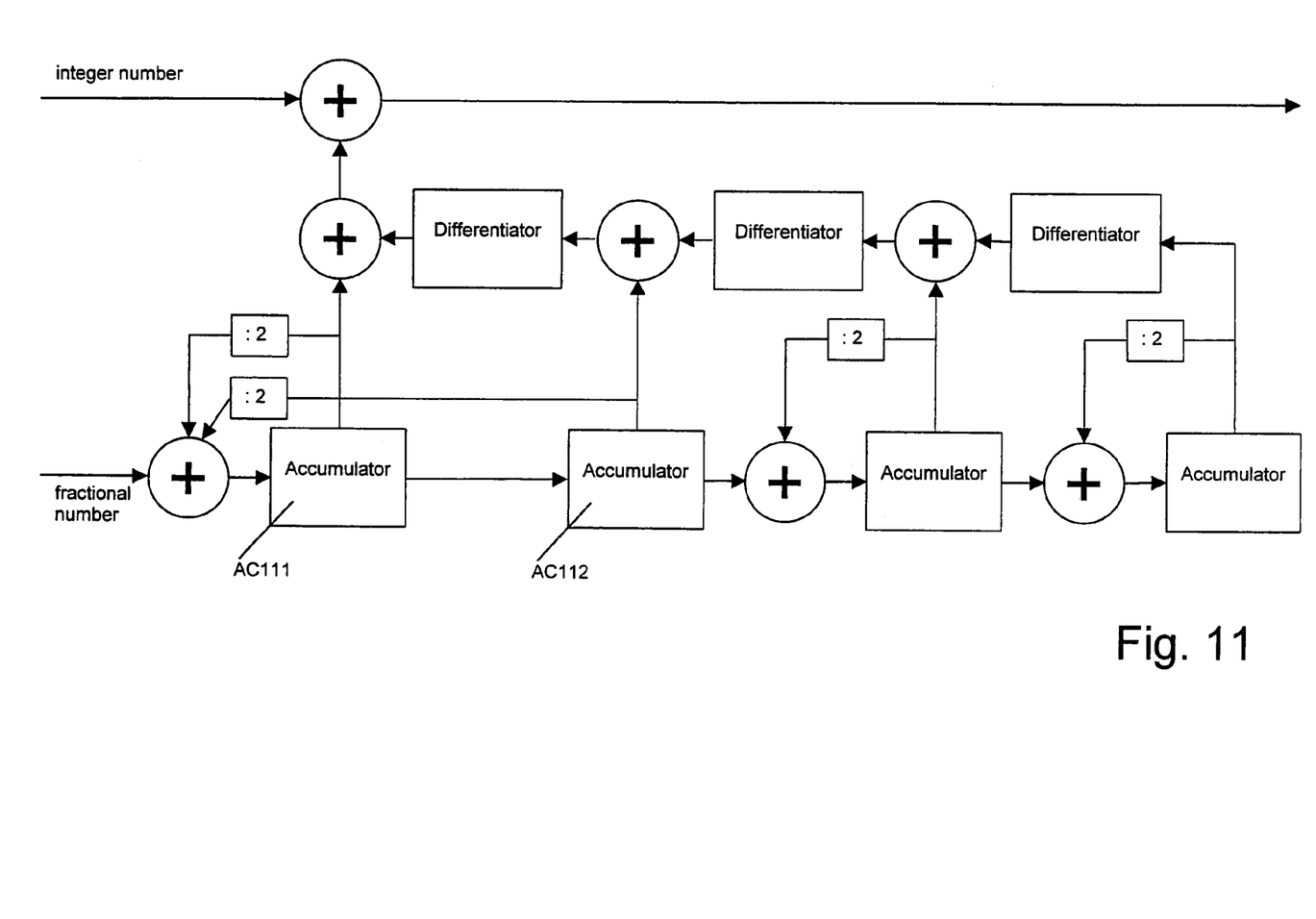
FIG. 11 is a second alternative embodiment of a divider ration controller according to the invention.
Figure 12:
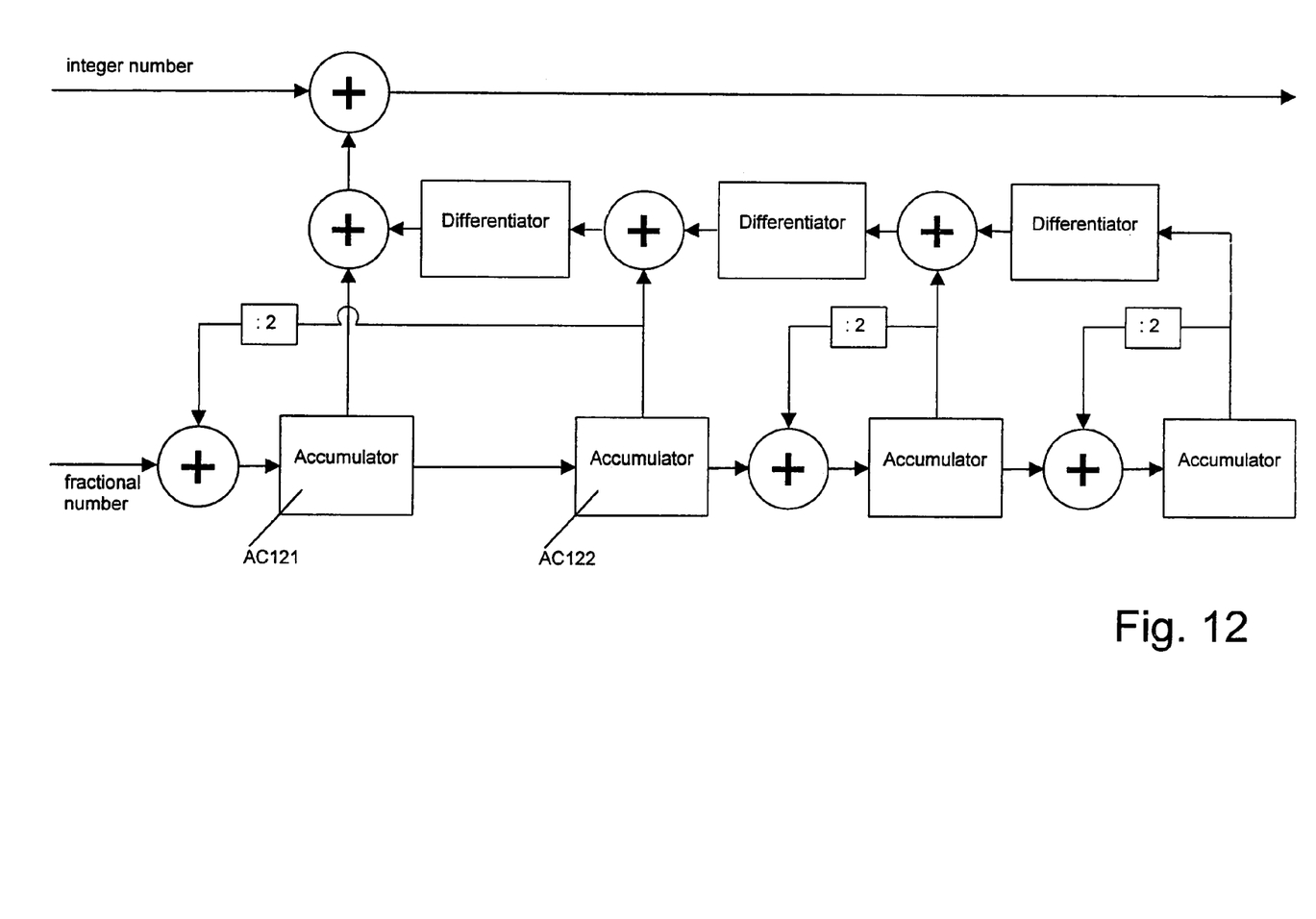
FIG. 12 is a third alternative embodiment of a divider ratio controller according to the invention.

Alternative embodiments of a divider ratio controller are shown in FIG. 10 to FIG. 12. In general, the factor by which the overflow signal of an accumulator is multiplied before it is fed back to the input of the respective accumulator can have any value and the factors can be different for various accumulators being part the same divider ratio controller. Besides, it is not necessary that the overflow signals of all accumulator stages are fed back. The input signal of an accumulator can also have a third component which depends on the overflow signal from a further accumulator. Finally, the second component of the input signal of an accumulator may not depend on the overflow signal of the respective accumulator but may depend on the overflow signal of a further accumulator.

Referring to FIG. 10, the input signal of the accumulator 102 consists only of the output signal of the preceding accumulator. The accumulator 102 has no second component. The overflow signal of the accumulator 104 is divided by 4 (multiplied by ¼) before it is fed back to the input of the respective accumulator.

Referring to FIG. 11, the input signal of the accumulator 111 has a third component which is given by the overflow signal of the following accumulator 112 divided by 2. The overflow signal of the accumulator 112 is not fed back to its input.

Referring to FIG. 12, the second component of the input signal of the accumulator 121 is given by the overflow signal of the accumulator 122 divided by 2. The overflow signal of the accumulator 121 is not fed back to its input.

The invention claimed is:

1. A variable frequency synthesizer comprising:
  a voltage controlled oscillator (VCO) generating oscillator signals ($u_{VCO}$) with a frequency dependent on input signals ($u_{cp}$) applied to said voltage controlled oscillator (VCO);
  a frequency divider receiving said oscillator signals and generating divider signals ($u_{DIV}$) with a frequency which is equal to a frequency of said oscillator signals divided by a divider ratio;
  a phase detector (PD) providing phase difference signals ($u_{PD}$) on the basis of a phase difference between said divider signals ($u_{DIV}$) and reference signals ($u_{REF}$), said phase difference signals determining said input signals applied to said voltage controlled oscillator;

a divider ratio controller (DRC) comprising a sigma-delta modulator and providing said divider ratio, said sigma-delta modulator comprising a plurality of accumulator stages being connected in cascade, each accumulator stage adding up input values and providing an overflow signal value when a maximum value is reached, a first accumulator stage in said cascade receiving a fractional part of an intended average divider ratio as a first component of an input value, each following accumulator receiving an accumulator value of an accumulator preceding said following accumulator and adjacent to said following accumulator as a first component of an input value, each overflow signal value being differentiated as many times as accumulator stages are preceding an accumulator stage providing said respective overflow signal value in said cascade before all overflow signal values are added up to form an output signal of said sigma-delta modulator, said divider ratio being a sum of said output signal of said sigma-delta modulator and an integer part of an intended average divider ratio;

characterized in that at least one input value has a second component which is equal to an overflow signal multiplied by a factor.

2. The variable frequency synthesizer according to claim 1, characterized in that each accumulator stage receives an input value having a second component which is equal to an overflow signal of said respective accumulator stage multiplied by a factor.

3. The variable frequency synthesizer according claim 1 or 2, characterized in that a charge pump circuit is connected between said phase detector and said voltage controlled oscillator receiving said phase detector signals and providing charge pump signals at the input of said voltage controlled oscillator.

4. The variable frequency synthesizer according to claim 3, characterized in that a loop filter is connected between said charge pump and said voltage controlled oscillator filtering said charge pump signals before providing them at the input of said voltage controlled oscillator.

5. A divider ratio controller in a variable frequency synthesizer comprising:

a voltage controlled oscillator (VCO) generating oscillator signals ($u_{VCO}$) with a frequency dependent on input signals ($u_{cp}$) applied to said voltage controlled oscillator (VCO);

a frequency divider receiving said oscillator signals and generating divider signals ($U_{DIV}$) with a frequency which is equal to a frequency of the oscillator signals divided by a divider ratio;

a phase detector (PD) providing phase difference signals ($u_{PD}$) on the basis of the phase difference between said divider signals ($u_{DIV}$) and reference signals ($u_{REF}$), said, phase difference signals determining said input signals applied to said voltage controlled oscillator;

said divider ratio controller (DRC) comprising a sigma-delta modulator and providing said divider ratio, said sigma-delta modulator comprising a plurality of accumulator stages being connected in cascade, each accumulator stage adding up input values and providing an overflow signal value when a maximum value is reached, a first accumulator stage in said cascade receiving a fractional part of an intended average divider ratio as a first component of an input value, each following accumulator receiving an accumulator value of an accumulator preceding said following accumulator and adjacent to said following accumulator as a first component of an input value, each overflow signal value being differentiated as many times as accumulator stages are preceding an accumulator stage providing said respective overflow signal value in said cascade before all overflow signal values are added up to form an output signal of said sigma-delta modulator, said divider ratio being a sum of said output signal of said sigma-delta modulator and an integer part of an intended average divider ratio;

characterized in that at least one input value has a second component which is equal to an overflow signal multiplied by a factor.

6. A method for operating a divider ratio controller in a variable frequency synthesizer with a voltage controlled oscillator (VCO) generating oscillator signals ($u_{VCO}$) with a frequency dependent on input signals ($u_{cp}$) applied to said voltage controlled oscillator (VCO), a frequency divider receiving said oscillator signals and generating divider signals ($U_{DIV}$) with a frequency which is equal to a frequency of said oscillator signals divided by a divider ratio, a phase detector (PD) providing phase difference signals ($u_{PD}$) on the basis of the phase difference between said divider signals ($u_{DIV}$) and reference signals ($u_{REF}$), said phase difference signals determining said input signals applied to said voltage controlled oscillator, said divider ratio controller (DRC) comprising a sigma-delta modulator with a plurality of accumulator stages and providing said divider ratio, said accumulator stages being connected in cascade, comprising the following steps:

a first accumulator stage in said cascade receiving a fractional part of an intended average divider ratio as a first component of an input value, each following accumulator receiving an accumulator value of an accumulator preceding said following accumulator and adjacent to said following accumulator as a first component of an input value;

each accumulator stage adding up input values;

each accumulator stage providing an overflow signal value when a maximum value is reached;

each overflow signal value being differentiated as many times as accumulator stages are preceding an accumulator stage providing said respective overflow signal value in said cascade;

adding up said overflow signals of said sigma-delta modulators and an integer part of an intended average divider ratio to generate said divider ratio;

characterized in that the following step:

an overflow signal being multiplied by a factor and being provided as second component of an input value.

\* \* \* \* \*